United States Patent [19]
Wei et al.

[11] Patent Number: 5,880,579
[45] Date of Patent: Mar. 9, 1999

[54] VCO SUPPLY VOLTAGE REGULATOR FOR PLL

[75] Inventors: Shuran Wei, Bloomington; Daniel J. Baxter, St. Paul; Alan S. Fiedler, Minneapolis, all of Minn.

[73] Assignee: LSI Logic Corporation, Milpitas, Calif.

[21] Appl. No.: 887,487

[22] Filed: Jul. 2, 1997

[51] Int. Cl.$^6$ .............................. G05F 1/40; H03B 27/00
[52] U.S. Cl. ........................ 323/282; 331/57; 331/175
[58] Field of Search ................................. 323/282, 281, 323/280, 314; 331/113 R, 186, 175, 181, 109, 57; 363/16, 17

[56] References Cited

U.S. PATENT DOCUMENTS 4,535,399  8/1985  Szepesi ...................................... 363/41
5,604,466  2/1997  Dreps et al. .............................. 331/113

*Primary Examiner*—Peter S. Wong
*Assistant Examiner*—Rajnikant B. Patel
*Attorney, Agent, or Firm*—Westman, Champlin & Kelly, P.A.

[57] ABSTRACT

A VCO supply voltage regulator includes a control voltage input, first and second supply voltage inputs, a regulated voltage output, a current source and an amplifier. The current source is coupled between the first voltage supply input and the regulated voltage output and has a bias input. The amplifier has an amplifier input coupled to the control voltage input, an amplifier output coupled to the bias input and a feedback input coupled to the regulated voltage output.

16 Claims, 4 Drawing Sheets

VCO SUPPLY VOLTAGE REGULATOR FOR PLL

CROSS-REFERENCE TO RELATED APPLICATION

Cross-reference is hereby made to U.S. Pat. No. 5,714,912 for a "VCO Supply Voltage Regulator," which was filed on Aug. 22, 1996, and is assigned to the same assignee.

BACKGROUND OF THE INVENTION

The present invention relates to semiconductor integrated circuits and, more particularly, to an on-chip supply voltage regulator for regulating power supplied to a voltage controlled oscillator (VCO) in a phase-locked loop (PLL).

A certain class of VCOs are built from a series of inverting delay elements, with the output of each delay element connected to the input of the next delay element. When the number of inverting delay elements is odd and other conditions are met, the series of inverting delay elements will oscillate. The propagation delay through each delay element is typically set by the current available in the delay element to charge and to discharge the load present at its output. By controlling this current, the propagation delay and thus the frequency of oscillation is thereby controlled. The current available in each delay element is typically set by a voltage, hence the frequency of oscillation is voltage-controlled.

Voltage-controlled oscillators are used in a variety of applications, including PLLs. A PLL is constructed by combining a VCO in a closed-loop with a phase detector, a charge pump and a filter. The performance of the PLL regarding the spectral content of the signal at the VCO output is dependent on, among other things, the sensitivity of the VCO frequency to changes in power supply voltage. This parameter is commonly referred to as VCO power supply gain, and is specified in MHz/V. There is a continuing need for VCOs having a very low VCO power supply gain.

SUMMARY OF THE INVENTION

The VCO supply voltage regulator of the present invention includes a control voltage input, first and second voltage supply inputs, a regulated voltage output, a current source and an amplifier. The current source is coupled between the first voltage supply input and the regulated voltage output and has a bias input. The amplifier has an amplifier input coupled to the control voltage input, an amplifier output coupled to the bias input and a feedback input coupled to the regulated voltage output.

In one embodiment, the current source includes a P-channel transistor having a gate coupled to the amplifier output, a source coupled to the first voltage supply input and a drain coupled to the regulated voltage output. The amplifier includes a common-gate amplifier formed of a P-channel transistor and an N-channel transistor. The P-channel transistor has a gate coupled to the amplifier input, a source coupled to the feedback input and a drain coupled to the amplifier output. The N-channel transistor has a gate coupled to the amplifier input, a source coupled to the second voltage supply input, and a drain coupled to the amplifier output.

The voltage generated on the regulated voltage output is set by setting the gain of the amplifier and is substantially independent of the voltage on the first voltage supply terminal. The regulator therefore has a very low power supply gain. With only three transistors, the regulator is simple to implement and consumes a small area on an integrated circuit.

DETAILED DESCRIPTION OF THE PREFERRED EMBODIMENTS

The VCO supply voltage regulator of the present invention is used in a phase-locked loop (PLL) for reducing sensitivity to power supply noise. PLLs are used in integrated circuits, such as application specific integrated circuits (ASIC), for clock synchronization and recovery of serial data streams. Because of variations in the fabrication process and other operating conditions, individual clock delays may be different from one integrated circuit to the next. These differences may create clock skew between each integrated circuit and an external system clock. Clock skew can significantly degrade performance and make it difficult to synchronize an individual clock edge with the system clock edge. To minimize clock skew and achieve synchronization, a PLL is used to track the system clock or incoming serial data stream, compare it with the on-chip clock, detect the phase or frequency difference and then make necessary adjustments to the on-chip clock until the on-chip clock matches the system clock.

Figure 1:
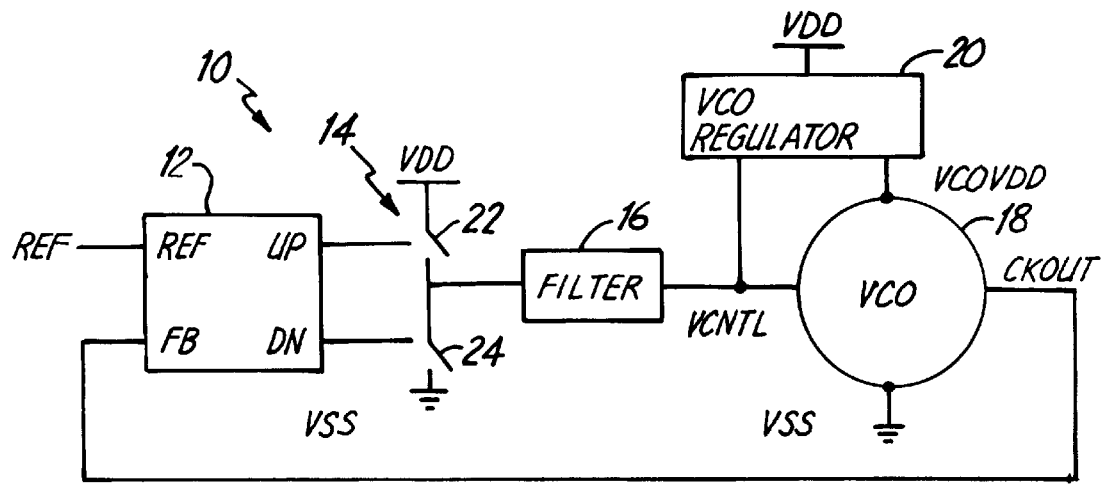
FIG. 1 is a block diagram of a phase-locked loop (PLL) having a VCO supply voltage regulator of the present invention.

FIG. 1 is a block diagram of a phase-locked loop (PLL) 10 which includes voltage supply terminals VDD and VSS, phase/frequency detector 12, charge pump 14, loop filter 16, VCO 18 and VCO supply voltage regulator 20. In an integrated circuit application, voltage supply terminals VDD and VSS are connected to the power and ground supply rails of the integrated circuit. Phase/frequency detector 12 has a reference input REF, a feedback input FB, an "up" charge control output UP and "down" charge control DN. Phase detector 12 receives a reference signal, such as an external system clock signal or a serial data stream on reference input REF and compares the phase and frequency of the reference signal with an on-chip clock signal generated on VCO clock output CKOUT. Phase detector 12 generates "up" and "down" phase control signals on phase control outputs UP and DN, respectively as a function of the difference in phase and frequency and applies the phase control signals to switches 22 and 24 of charge pump 14.

When the system clock or serial data stream transitions lead the on-chip clock transitions, phase detector 12 generates an "up" phase control signal on phase control output UP which closes switch 22 to increase the voltage across loop filter 16. When the system clock or serial data stream transitions lags the on-chip clock transitions, phase detector 12 generates a "down" phase control signal on phase control output DN which closes switch 24 to decrease the voltage across loop filter 16. The output of loop filter 16 is applied to control voltage input VCNTL of VCO 18.

VCO 18 is formed of a series of inverting delay elements. The output of each delay element connected to the input of the next delay element. When the number of inverting delay elements is odd and other conditions are met, the series of inverting delay elements will oscillate and provide the clock signal on VCO clock output CKOUT. The propagation delay through each delay element is set by the control voltage applied to control voltage input VCNTL. By controlling this voltage, the propagation delay and thus the frequency of oscillation of CKOUT is thereby controlled.

When CKOUT matches the system clock in phase and frequency, the phase detector 12 stops sending the phase control signals to charge pump 14 and the voltage at the output of loop filter 16 stabilizes. An example of a phase detector, charge pump and loop filter is disclosed in more detail in Fiedler et al. U.S. Pat. No. 5,633,889, which is entitled "Phase-Locked Loop For Capture Of High Speed Serial Data Streams" and is hereby incorporated by reference.

VCO supply voltage regulator 20 is coupled to control voltage input VCNTL and between voltage supply terminal VDD and VCO voltage supply input VCOVDD for regulating the voltage supplied to VCO 18. VCO supply voltage regulator 20 prevents changes in VDD from causing significant modulation in the switching delay of the VCO delay elements within VCO 18 and thus the oscillation frequency of the VCO. This limits the sensitivity of the VCO frequency to changes in the power supply voltage and greatly increases the performance of the PLL.

Figure 2A:
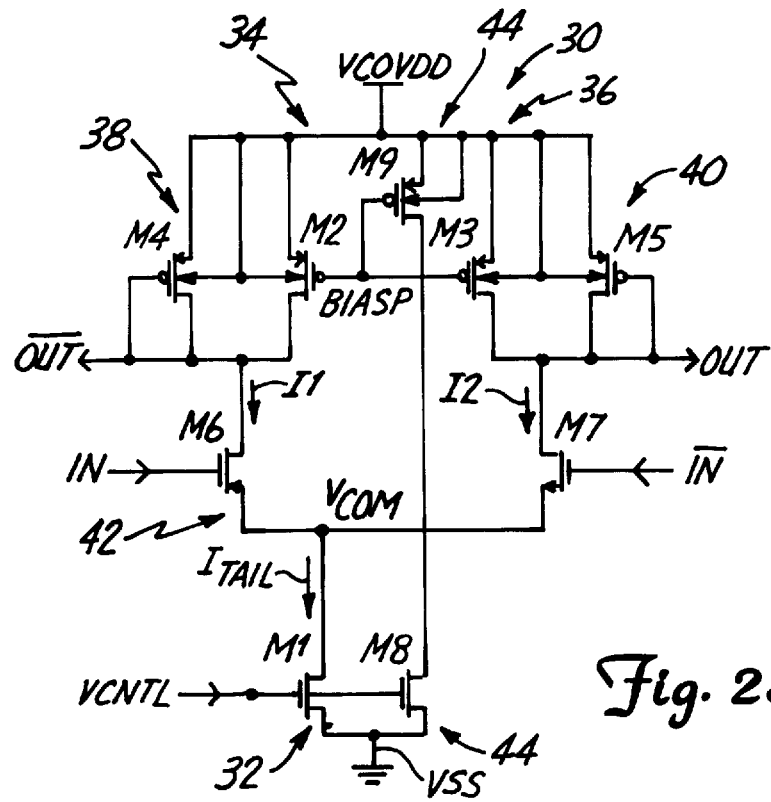
FIGS. 2A and 2B are schematic diagrams of examples of VCO differential delay elements within a VCO of the PLL shown in FIG. 1.

FIG. 2A is a schematic diagram of a basic differential inverting delay element 30 within VCO 18. Differential inverting delay element 30 includes tail current source 32, pull-up current sources 34 and 36, clamp circuits 38 and 40, current steering circuit 42 and pull-up bias generator 44. Tail current source 32 includes N-channel MOSFET M1 having a gate coupled to control voltage input VCNTL, a source coupled to voltage supply input VSS and a drain coupled to common voltage node $V_{COM}$. MOSFET M1 generates a tail current $I_{TAIL}$ at its drain as a function of the voltage on control voltage input VCNTL.

Pull-up current sources 34 and 36 include P-channel MOSFETs M2 and M3, respectively. MOSFET M2 has a gate coupled to P-channel bias node BIASP, a source and substrate coupled to VCOVDD and a drain coupled to output terminal $\overline{OUT}$. MOSFET M3 has a gate coupled to P-channel bias node BIASP, a source and a substrate coupled to VCOVDD and a drain coupled to output terminal OUT. MOSFETs M1, M2 and M3 are sized such that the combined pull-up current provided at the drains of MOSFETs M2 and M3 is one half of the tail current $I_{TAIL}$. The other half of the tail current $I_{TAIL}$ is supplied by clamp circuits 38 and 40.

Clamp circuits 38 and 40 include P-channel MOSFETs M4 and M5, respectfully. MOSFET M4 has a gate and drain coupled to output terminal $\overline{OUT}$ and a source and a substrate coupled to VCOVDD. MOSFET M5 has a gate and drain coupled to output terminal OUT and a source and a substrate coupled to VCOVDD.

Current steering circuit 42 includes N-channel MOSFETs M6 and M7 which steer the tail current $I_{TAIL}$ through either MOSFET M6 as current I1 or MOSFET M7 as current I2 as a function of the voltages on complementary inputs IN and $\overline{IN}$, respectively. MOSFET M6 has a gate coupled to input IN, a source coupled to common node $V_{COM}$ and a drain coupled to output terminal $\overline{OUT}$. MOSFET M7 has a gate coupled to input terminal $\overline{IN}$, a source coupled to common node $V_{COM}$ and a drain coupled to output terminal OUT.

Pull-up bias generator 44 includes N-channel MOSFET M8 and P-channel MOSFET M9. N-channel MOSFET M8 has a gate coupled to control voltage input VCNTL, a source coupled to VSS and a drain coupled to P-channel bias node BIASP. P-channel MOSFET M9 has a gate and drain coupled to P-channel bias node BIASP, and a source and substrate coupled to VCOVDD. Pull-up bias generator 44 generates a bias voltage on P-channel bias node BIASP for P-channel MOSFETs M2 and M3.

The switching delay through differential inverting delay element 30 is mostly a function of the voltage applied to control voltage input VCNTL, but is also a function of the voltage at VCOVDD. The voltage at common node $V_{COM}$ tracks changes in the voltage at VCOVDD, which modulates the drain-source voltage $V_{DS,M1}$ of N-channel MOSFET M1, and thus the current through MOSFET M1 because of the non-zero slope of the current-voltage curve of MOSFET M1 in saturation. This parasitic current modulation then results in a modulation in the switching delay of element 10 and thus the oscillation frequency of the VCO. Therefore, the voltage on applied to VCOVDD is preferably regulated.

Figure 2B:
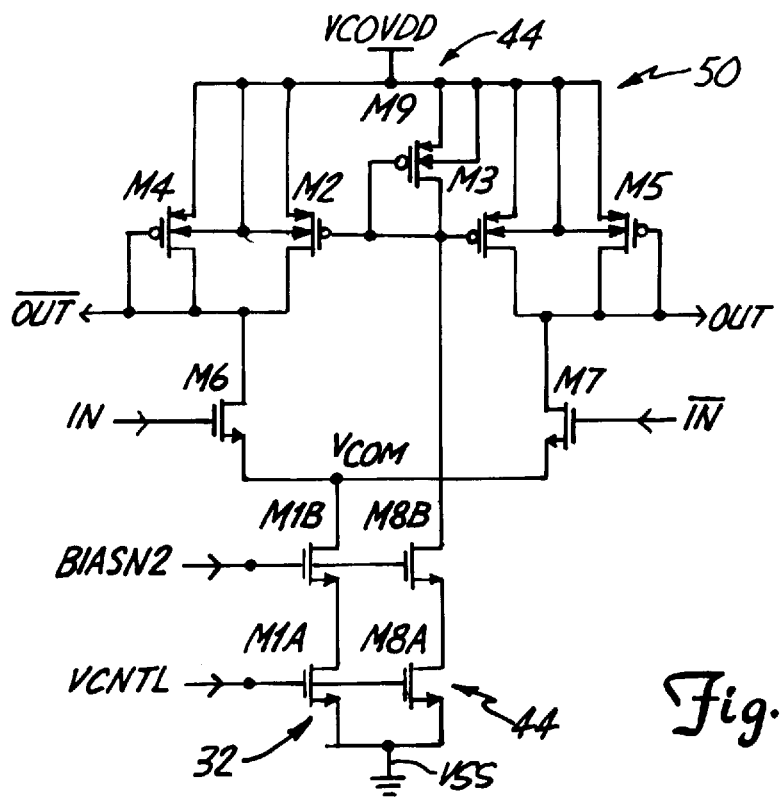

FIG. 2B is a schematic diagram of a differential inverting delay element 50 which is similar to differential inverting delay element 30, but further includes an additional cascode transistor in current source 32 and in pull-up bias generator 44. Current source 32 includes N-channel MOSFETs M1A and M1B which are connected in cascode with one another and are controlled by the voltages on control voltage input VCNTL and bias input BIASN2, respectively. Similarly, pull-up bias generator 44 includes N-channel MOSFETs M8A and M8B which are connected in cascode with one another and are controlled by the voltages on control voltage input VCNTL and bias input BIASN2, respectively. The addition of cascode MOSFETs M1B and M8B, when appropriately biased, dramatically reduces the VCO power supply gain. However, because the voltage on common node $V_{COM}$ will still follow the voltage on VCOVDD, as in the circuit shown in FIG. 2A, the tail current $I_{TAIL}$ is still modulated, though to a lesser degree, due to the non-zero slope in the cascode current source's current-voltage characteristic, leakage from the common node $V_{COM}$ to ground, and the body effect in N-channel MOSFET transistors M6 and M7.

Figure 3:
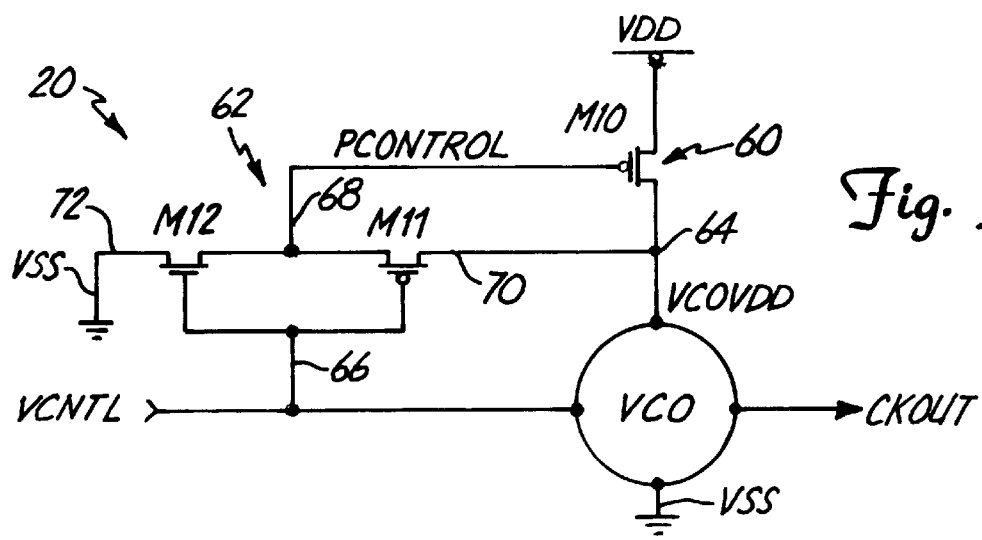
FIG. 3 is a schematic diagram of the VCO supply voltage regulator of the present invention.

FIG. 3 is a schematic diagram which illustrates VCO supply voltage regulator 20 in greater detail. VCO supply voltage regulator 20 includes current source 60 and common-gate amplifier 62. Current source 60 includes P-channel MOSFET M10. MOSFET M10 has a gate coupled to bias input PCONTROL, a source coupled to voltage supply terminal VDD and a drain coupled to regulated voltage output 64. Regulated voltage output 64 is coupled to VCO voltage supply input VCOVDD. Amplifier 62 is formed by P-channel MOSFET M11 and N-channel MOSFET M12 and has an amplifier input 66, an amplifier output 68, a positive feedback input 70 and a negative feedback input 72. MOSFET M11 has a gate coupled to amplifier input 66, a source coupled to positive feedback input 70 and a drain coupled to amplifier output 68. MOSFET M12 has a gate coupled to amplifier input 66, a source coupled to negative feedback input 72 and a drain coupled to amplifier output 68. Amplifier input 66 is coupled to control voltage input VCNTL. Amplifier output 68 is coupled to bias input PCONTROL. Positive feedback input 70 is coupled to regulated voltage output 64. Negative feedback input 72 is coupled to voltage supply terminal VSS.

During operation, the voltage on control voltage input VCNTL is amplified by amplifier 62 and applied to bias input PCONTROL of current source 60. Current source 60 adjusts the current supplied to VCO 18 and thus the voltage on VCO supply input VCOVDD as a function of the voltage applied to bias input PCONTROL. The voltage on VCO supply input VCOVDD is fed back to the source of MOSFET M11. The small signal gain from the voltage on VCOVDD to bias input PCONTROL is positive and is given by $g_{m,M11}/(g_{ds,M11}+g_{ds,M12})$, where $g_{m,M11}$ is the small signal transconductance from gate to source of MOSFET M11, $g_{ds,M11}$ is the small signal transconductance from drain to source of MOSFET M11 and $g_{ds,M12}$ is the small signal transconductance from drain to source of MOSFET M12. Since the gain from PCONTROL to VCOVDD is negative, this results in negative feedback.

The voltage on VCOVDD can be solved by looking at the drain currents of MOSFETs M11 and M12. In the saturation region, the drain current flowing through MOSFET M11 is given by:

$$I_{D,M11} = \frac{\mu_P C_{OX}}{2} \left( \frac{W_{M11}}{L_{M11}} \right) (V_{VCOVDD} - V_{VCNTL} - |V_{TP}|)^2 \qquad \text{Eq. 1}$$

In Equation 1, $I_{D,M11}$ is the drain current through MOSFET M11, $\mu_P$ is the P-channel hole mobility of MOSFET M11, $C_{ox}$ is the gate oxide capacitance per unit area of MOSFET M11, $W_{M11}$ is the gate width of MOSFET M11, $L_{M11}$ is the gate length of MOSFET M11, $V_{VCOVDD}$ is the voltage on VCOVDD, $V_{VCNTL}$ is the voltage on VCNTL and $V_{TP}$ is the P-channel threshold voltage of MOSFET M11.

The drain current flowing through MOSFET M12 in the saturation region is given by Equation 2:

$$I_{D,M12} = \frac{\mu_N C_{OX}}{2} \left( \frac{W_{M12}}{L_{M12}} \right) (V_{VCNTL} - V_{TN})^2 \qquad \text{Eq. 2}$$

In Equation, 2 $I_{D,M12}$ is the drain current flowing through MOSFET M12, $\mu_N$ is the N-channel electron mobility, $W_{M12}$ is the gate width of MOSFET M12, $L_{M12}$ is the gate length of MOSFET M12 and $V_{TN}$ is the N-channel threshold voltage of MOSFET M12.

Since $I_{D,M11}=I_{D,M12}$, Equations 1 and 2 can be solved for the voltage on VCVODD:

$$V_{VCOVDD} = V_{VCNTL} + |V_{TP}| + (V_{CNTL} - V_{TN})\sqrt{\frac{(W_{M11}/L_{M11})\mu_P}{(W_{M12}/L_{M12})\mu_N}} \qquad \text{Eq. 3}$$

The voltage on VCOVDD is therefore substantially independent of the voltage on VDD. By adjusting the gate widths of MOSFETs M11 and M12, the voltage on VCOVDD can be tuned to any value to make VCO 18 functional. In one embodiment, VCOVDD is tuned such that tail current sources of the VCO delay elements in VCO 18 are in saturation, but not excessively so.

Figure 4:
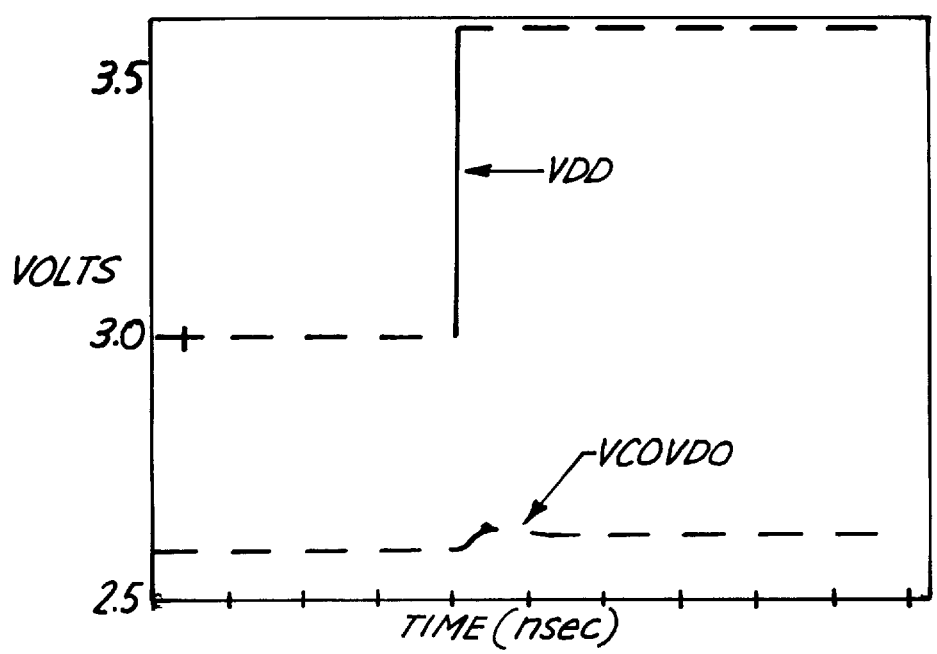
FIG. 4 is a waveform diagram illustrating power supply gain for the VCO supply voltage regulator shown in FIG. 3.

FIG. 4 is a waveform diagram illustrating the voltages on VDD and VCOVDD over time. $V_{VCNTL}$ was set to 1.2 volts. At 200 ns, VDD increases 600 mV. However, the regulated voltage on VCOVDD increases only 25 mV. This corresponds to a 28 dB suppression in the transfer of noise from VDD to VCOVDD. Thus VCO 18 has a very low power supply gain with the VCO supply voltage regulator of the present invention. The VCO supply voltage regulator of the present invention is particularly useful in integrated circuits since it can be implemented with three transistors. The regulator therefore does not consume valuable area on the integrated circuit.

In an alternative embodiment, VCO supply voltage regulator 42 is inverted. In this embodiment, current source 44 includes an N-channel MOSFET which is coupled between VCO 40 and voltage supply terminal VSS. MOSFETs 11 and 12 are replaced with N-channel and P-channel transistors, respectively, and the source of MOSFET M12 is coupled to voltage supply terminal VDD.

Figure 5:
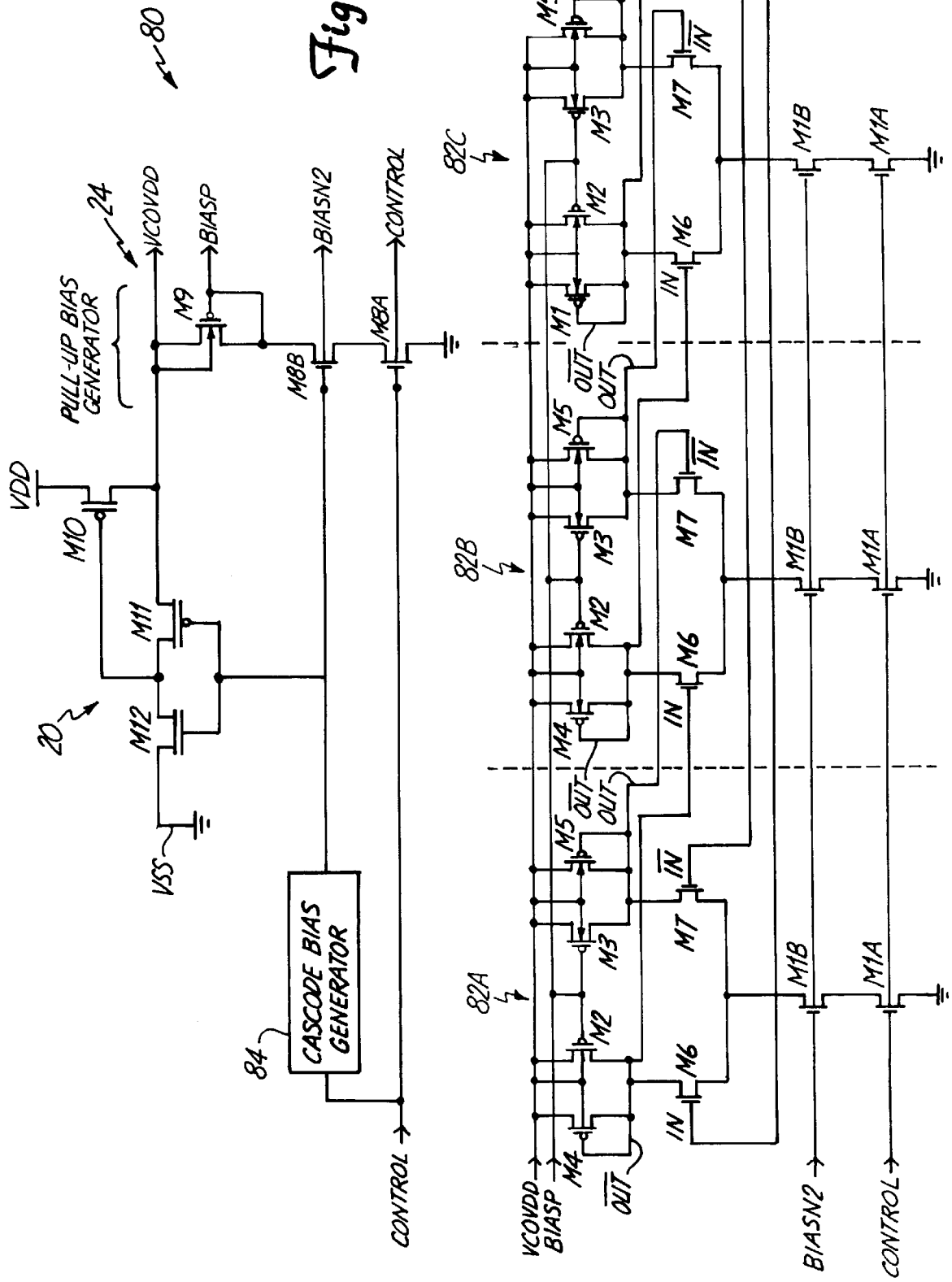
FIG. 5 is a schematic diagram of a three-stage VCO according to the present invention.

FIG. 5 is a schematic diagram of VCO supply voltage regulator 20 used with a three stage VCO 80 in accordance with one embodiment of the present invention. VCO 80 includes identical VCO delay elements 82A, 82B and 82C, cascode bias generator 84 and pull-up bias generator 24. Pull-up bias generator 24 is common to each VCO delay element 82A, 82B, and 82C. Delay elements 82A–82C are coupled together in series with the outputs OUT and $\overline{\text{OUT}}$ of each delay element coupled to the inputs $\overline{\text{IN}}$ and IN, respectively, of the next delay element such that the delay elements will oscillate.

Bias input BIASN2 is generated by cascode bias generator 84 which is coupled between control voltage input VCNTL and the gate of N-channel MOSFET M10. Any suitable cascode bias generator can be used with the present invention, such as those disclosed in co-pending U.S. application Ser. No. 08/667,071, filed Jun. 20, 1996, which is entitled HIGH SWING CASCODE CURRENT MIRROR and is hereby incorporated by reference.

Although the present invention has been described with reference to preferred embodiments, workers skilled in the art will recognize that changes may be made in form and detail without departing from the spirit and scope of the invention. For example, although the present invention has been described with reference to a particular differential delay element, other differential delay elements can also be used with the present invention. Also, the present invention is useful with single ended VCO delay elements. The VCO supply voltage regulator of the present invention can be implemented with various technologies other than MOS technology. The voltage supply terminals can be relatively positive or relatively negative, depending upon the particular convention adopted and the technology used. Likewise, the term "coupled" can include various types of connections or couplings and can include a direct connection or a connection through one or more intermediate components.

What is claimed is:

1. A VCO supply voltage regulator comprising:
   a control voltage input;
   first and second voltage supply inputs;
   a regulated voltage output;
   a current source coupled between the first voltage supply input and the regulated voltage output and having a bias input; and
   an common-gate amplifier having an amplifier input coupled to the control voltage input, an amplifier output coupled to the bias input and a feedback input coupled to the regulated voltage output.

2. The VCO supply voltage regulator of claim 1 wherein the current source comprises a P-channel transistor having a gate coupled to the amplifier output, a source coupled to the first voltage supply input and a drain coupled to the regulated voltage output.

3. The VCO supply voltage regulator of claim 1 wherein the amplifier comprises:
   a P-channel transistor having a gate coupled to the amplifier input, a source coupled to the feedback input and a drain coupled to the amplifier output; and
   an N-channel transistor having a gate coupled to the amplifier input, a source coupled to the second voltage supply input, and a drain coupled to the amplifier output.

4. The VCO supply voltage regulator of claim 1 wherein the current source and common-gate amplifier together consist of only three transistors.

5. A VCO supply voltage regulator comprising:
a control voltage input;
first and second voltage supply inputs;
a regulated voltage output;
a first transistor having a gate, a source coupled to the first voltage supply input, and a drain coupled to the regulated voltage output;
a second transistor having a gate coupled to the control voltage input, a source coupled to the regulated voltage output, and a drain coupled to the gate of the first transistor; and
a third transistor having a gate coupled to the control voltage input, a source coupled to the second voltage supply input, and a drain coupled to the gate of the first transistor.

6. The VCO supply voltage regulator of claim 5 wherein the first and second transistors comprise P-channel transistors and the third transistor comprises an N-channel transistor.

7. A phase-locked loop comprising:
first and second supply terminals;
a phase detector having a reference input, a feedback input, and a charge control output;
a charge pump coupled to the charge control output;
a loop filter coupled to the charge pump;
a voltage controlled oscillator having a control voltage input coupled to the loop filter, a clock output coupled to the feedback input, and first and second VCO supply inputs, wherein the second supply input is coupled to the second supply terminal; and
a voltage regulator comprising:
    a current source coupled between the first voltage supply terminal and the first VCO supply input and having a bias input; and
    an amplifier having an amplifier input coupled to the control voltage input, an amplifier output coupled to the bias input and a feedback input coupled to the first VCO supply input.

8. The phase-locked loop of claim 7 wherein the current source comprises a P-channel transistor having a gate coupled to the amplifier output, a source coupled to the first voltage supply terminal and a drain coupled to the first VCO supply input.

9. The phase-locked loop of claim 7 wherein the amplifier comprises:
a P-channel transistor having a gate coupled to the amplifier input, a source coupled to the feedback input and a drain coupled to the amplifier output; and
an N-channel transistor having a gate coupled to the amplifier input, a source coupled to the second voltage supply terminal, and a drain coupled to the amplifier output.

10. The phase-locked loop of claim 7 wherein the amplifier comprises a common-gate amplifier.

11. The phase-locked loop of claim 7 wherein the current source and common-base amplifier together consist of only three transistors.

12. An integrated circuit comprising:
a power supply rail and a ground supply rail;
a VCO delay element having a power input, a ground input, a control voltage input and an output, wherein the ground input is coupled to the ground supply rail; and
a VCO supply voltage regulator comprising:
    a current source coupled between the power supply rail and the power input and having a bias input; and
    an amplifier having an amplifier input coupled to the control voltage input, an amplifier output coupled to the bias input and a feedback input coupled to the power input.

13. The integrated circuit of claim 12 wherein the current source and amplifier together consist of no more than three transistors.

14. The integrated circuit of claim 12 wherein the amplifier comprises a common-gate amplifier.

15. An integrated circuit comprising:
a power supply rail and a ground supply rail;
a VCO delay element having a power input, a ground input, a control voltage input and an output, wherein the ground input is coupled to the ground supply rail; and
a three-transistor VCO supply voltage regulator comprising:
    a current source coupled between the power supply rail and the power input and having a bias input; and
    an amplifier having an amplifier input coupled to the control voltage input, an amplifier output coupled to the bias input, a positive feedback input coupled to the power input and a negative feedback input coupled to the ground input.

16. An integrated circuit comprising:
a power supply rail and a ground supply rail;
a VCO delay element having a power input, a ground input, a control voltage input and an output, wherein the ground input is coupled to the ground supply rail; and
a VCO supply voltage regulator comprising no more than three transistors, which is coupled between the power supply rail and the power input and has a reference input coupled to the control voltage input.

* * * * *